United States Patent
Smith et al.

(12) 
(10) Patent No.: US 6,603,661 B2
(45) Date of Patent: Aug. 5, 2003

(54) UNIVERSAL FAN CAGE FOR HOT-PLUGGABLE FANS

(75) Inventors: Kelly K. Smith, Spring, TX (US); Karl J. Dobler, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/020,375

(22) Filed: Dec. 14, 2001

(65) Prior Publication Data

US 2003/0112601 A1 Jun. 19, 2003

(51) Int. Cl.$^7$ .................................................. H05K 7/20
(52) U.S. Cl. ........................ 361/695; 165/80.3; 454/184
(58) Field of Search ............................... 454/184, 80.3, 454/121–126; 415/213.1, 214.1; 312/236; 211/41.17; 361/690, 694, 695, 687, 717–719; 248/678, 680, 681, 500, 510

(56) References Cited

U.S. PATENT DOCUMENTS

| | | | | | |
|---|---|---|---|---|---|
| 5,680,295 A | * | 10/1997 | Le et al. | ...................... | 361/695 |
| 6,005,770 A | * | 12/1999 | Schmitt | ...................... | 361/695 |
| 6,031,719 A | * | 2/2000 | Schmitt et al. | ............. | 361/695 |
| 6,213,819 B1 | * | 4/2001 | Fan | ............................. | 439/894 |
| 6,269,001 B1 | * | 7/2001 | Matteson et al. | ........... | 361/695 |
| 6,373,698 B1 | * | 4/2002 | Christensen | ................. | 361/695 |
| 6,400,568 B1 | * | 6/2002 | Kim et al. | | |
| 6,478,284 B2 | * | 11/2002 | Qiu | ............................. | 248/680 |

* cited by examiner

*Primary Examiner*—Gerald Tolin

(57) ABSTRACT

The present invention provides a system to mount a group of fans on the system board of a computer server. The mounting system allows for the fans to be installed or removed as a group or as individual components without the use of tools. The fans are preferably hot-pluggable, or capable of being installed or removed without having to turn off the server. Therefore, an entire group of fans can be removed from a server without using any tools or having to power down the system. The fans can also be removed and installed as individual units, without effecting the other fans in the group.

10 Claims, 4 Drawing Sheets

UNIVERSAL FAN CAGE FOR HOT-PLUGGABLE FANS

CROSS-REFERENCE TO RELATED APPLICATIONS

Not applicable.

STATEMENT REGARDING FEDERALLY SPONSORED RESEARCH OR DEVELOPMENT

Not Applicable.

BACKGROUND OF THE INVENTION

1. Field of the Invention

The present invention relates to a structural method of mounting fans on a computer system board. More precisely, the present invention relates to a mounting arrangement allowing the installation and removal of one or more hot-pluggable fans, either individually or as a group, in without the use of tools.

2. Background of the Invention

The necessity for specialized computer equipment has increased dramatically over recent years. Corporations, both large and small, as well as individual consumers have come to depend on computers to enhance and assist them in a broad assortment of tasks. For the individual or small business, personal computers are typically relatively compact and streamlined, often comprising a monitor, a keyboard, a mouse, and a CPU "box" that sits on a desktop or on the floor. These personal computers, although considered compact when deployed in relatively small numbers, can be quite cumbersome and bulky when deployed in larger quantities. It is not uncommon for an organization to require several computers to act as servers controlling their local area networks. For larger corporations that require numerous servers, the traditional CPU package is not practical to house servers. For such operations, an industry standard EIA (Electronics Industries Alliance) rack is often used to contain servers in a stacked arrangement that uses the available space more efficiently.

Such electronics racks are relatively simple structures that closely resemble open-frame bookcases. Computer server/component racks are typically constructed with perforated, hinged front-doors, rigid sides and a removable rear panel. Industry standard 19" EIA electronics racks are designed typically to house a column of electronics packages that are 17¾" in width and with varying depths. The height of an electronics package can vary but, to be compatible with the rack mounting structure, must be an integer multiple of an EIA unit called simply the "U." An EIA U is 1.75 inches. Electronic equipment generally has a height in multiples of "Us" e.g., 1 U (1.75"), 2 U (3.50"), 3 U (5.25"), etc. Although it is preferred that the height of the electronics components be a multiple of the standard EIA unit U, the dimension of the EIA unit is understood to represent a maximum allowable height, including both the height of the component and any clearance required. This amount of clearance aides in the installation of the rack mounted electronics and promotes interference free insertion and removal.

Typically, electronic components may be secured within the rack using a pair of drawer slides. The drawer slides, usually ball-bearing supported rails, are secured in place within the rack frame. Corresponding rails are located on the side surfaces of the electronics component to be mounted, thus allowing the component to be pulled in and out of the rack frame easily to allow quick and frequent access.

As the computing needs of both large and small businesses increase, there is increasing demand for computer servers to become smaller and more compact. This demand is coupled with the demand that the systems be easier to maintain and service. A typical server comprises at least one, often times more than one, of each of the following components: system board including processors and memory; power supplies; disk drives, including hard disks, floppy drives, CD-ROM drives, etc.; peripheral component interface (PCI) buses, and cooling fans. Mounting all of these components in a dense packed server, some as small as 1 U or 2 U, creates many interface issues associated with maintaining and accessing the server.

The cooling fans in a server may have to be removed and installed, both for servicing the fan and servicing other components. A typical server has several fans for circulating air through the system to aid in controlling the temperature. These fans run essentially continuously and will likely have to be replaced several times during the life of the server in the event of a fan failure. Additionally, many other standard maintenance tasks for the server include first removing the fans in order to gain better access to other components. Most prior art cooling fans were fixed in place by one or more screws, which made the removal of a bank of several fans a tedious and time consuming process.

Therefore, there remains a need in the art for an arrangement that allows for easy installation and removal of fans from a server computer without using any tools. The present invention overcomes the deficiencies of the prior art while focusing on these needs.

BRIEF SUMMARY OF THE INVENTION

The present invention overcomes the deficiencies of the prior art by providing a system to mount a group of fans on the system board of a computer server. The mounting system allows for the fans to be installed or removed as a group or as individual components without the use of tools. The fans are hot-pluggable, or capable of being installed or removed without having to turn off the server. Therefore, an entire group of fans can be removed from a server without using any tools or having to power down the system. The fans can also be removed and installed as individual units, without effecting the other fans in the group.

BRIEF DESCRIPTION OF THE DRAWINGS

For a more detailed description of the preferred embodiment of the present invention, reference will now be made to the accompanying drawings, wherein.

NOTATION AND NOMENCLATURE

Figure 1:
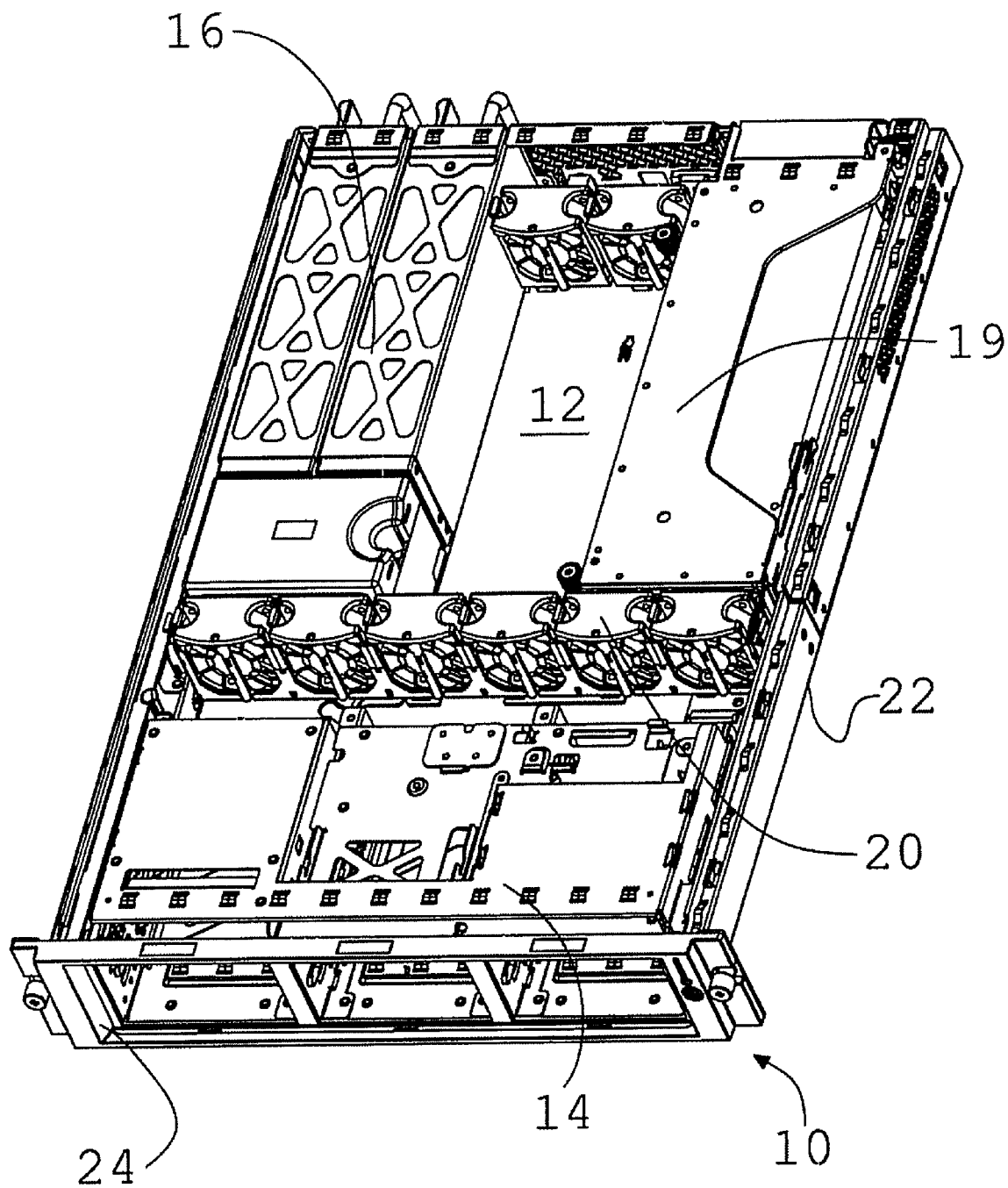
FIG. 1 is a perspective view of a dense server constructed in accordance with one embodiment of the present invention.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF THE PREFERRED EMBODIMENTS

In the description that follows, like parts are marked throughout the specification and drawings with the same reference numerals, respectively. The drawing figures are not necessarily to scale. Certain features of the invention may be shown exaggerated in scale or in somewhat schematic form and some details of conventional elements may not be shown in the interest of clarity and conciseness.

The present invention relates to methods and apparatus for accessing and servicing computer cooling fans. In order to fully describe the preferred embodiments of the present invention, reference will be made throughout this description to a computer server, but the concepts of the present invention may find utility in other types of computers and in a non-computer electronic environment. The present invention is susceptible to embodiments of different forms. There are shown in the drawings, and herein will be described in detail, specific embodiments of the present invention with the understanding that the present disclosure is to be considered an exemplification of the principles of the invention, and is not intended to limit the invention to that illustrated and described herein.

Referring to FIG. 1, a server assembly 10 is shown comprising a system board 12, disk drives 14, power supplies 16, a PCI cage assembly 19, and a fan cage assembly 20. A slide rail 22 is located on either side of the chassis 24 and interfaces with the server cabinet (not shown). During normal operation, a cover (not shown) attaches to the chassis 24 fully enclosing the server assembly 10 and the assembly is contained within a server cabinet. To perform maintenance on the server assembly 10, the assembly is partially extended from the cabinet on rails, somewhat like a drawer being opened. The cover is then removed to expose the internal components.

Figure 2:
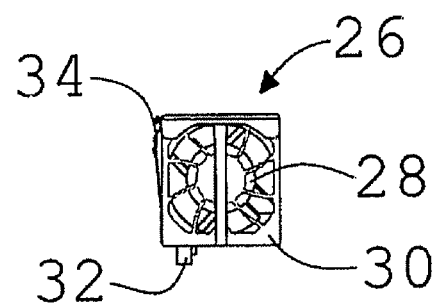
FIG. 2 is a vertical view of single fan assembly.
Figure 3:
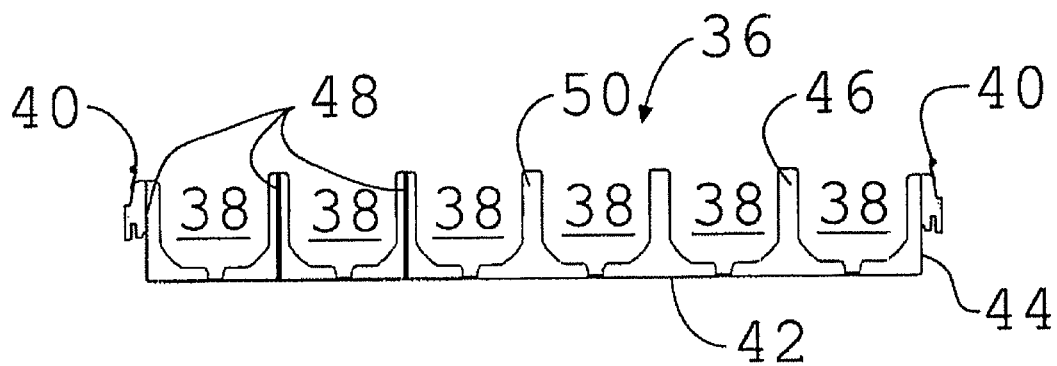
FIG. 3 is a partial cross-sectioned vertical view of a fan cage constructed in accordance with one embodiment of the present invention.

Now referring to FIG. 2, a fan assembly 26 comprises an electric fan 28, a housing 30, a spring latch 34, and an electrical plug 32. Electric fan 28 may be any compact electrical fan as used in electronic cooling applications. Electric fan 28 is powered by electrical current supplied from the equipment being cooled, e.g., server 10, through blind mating electrical plug 32. Housing 30 provides support and protection for the fan 28 and is adapted to interface with a fan cage (FIG. 3). Housing 30 further includes a spring latch 34 or other easily manipulated latching mechanism for securing the housing 30 to the fan cage.

Referring now to FIG. 3, one embodiment of a fan cage 36 is capable of holding 6 fans. The fan cage 36 generally comprises two end portions 44 and two side portions 46 (only one side portion is shown) integrally connected to a base 42 forming a rectangular receptacle having an open top. Each side portion 46 has an equal number of protrusions 50 in direct opposition to corresponding protrusions (not shown) on the other side of portion 46. Between each pair of protrusions 50 is a retainer wall 48. The side portions 46, base 42, and retaining walls 48 form receptacles 38 sized to hold a single fan assembly 26. The base 42 has openings to allow the electrical plug 32 to extend below the fan cage 36. Retaining walls 48 provide an attachment point for interfacing with the spring latch 34 of the fan assembly. Each end portion 44 also includes a spring latch 40 or other easily manipulated latching mechanism for securing the fan cage 36 to the chassis 24.

Figure 4:
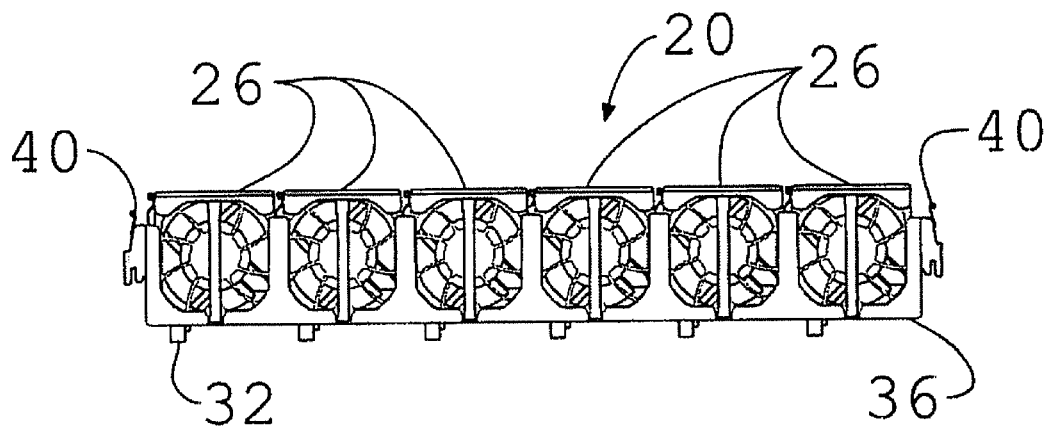
FIG. 4 is a vertical view of a fan cage assembly constructed in accordance with one embodiment of the present invention.

Referring now to FIG. 4, the fan cage 36 is shown with all six fan assemblies 26 installed forming a fan cage assembly 20. The fan assemblies 26 are installed into the fan cage 36 by simply pressing the fan assemblies into the receptacles 38. Spring latch 34 is preferably designed to automatically latch the fan assembly 26 in place when the assembly is in the proper position relative to the fan cage 36. The openings for the electrical plugs 32 ensure that the fan assemblies 26 can only be installed in a single orientation, preferably with all the fan assemblies facing the same direction.

Figure 5:
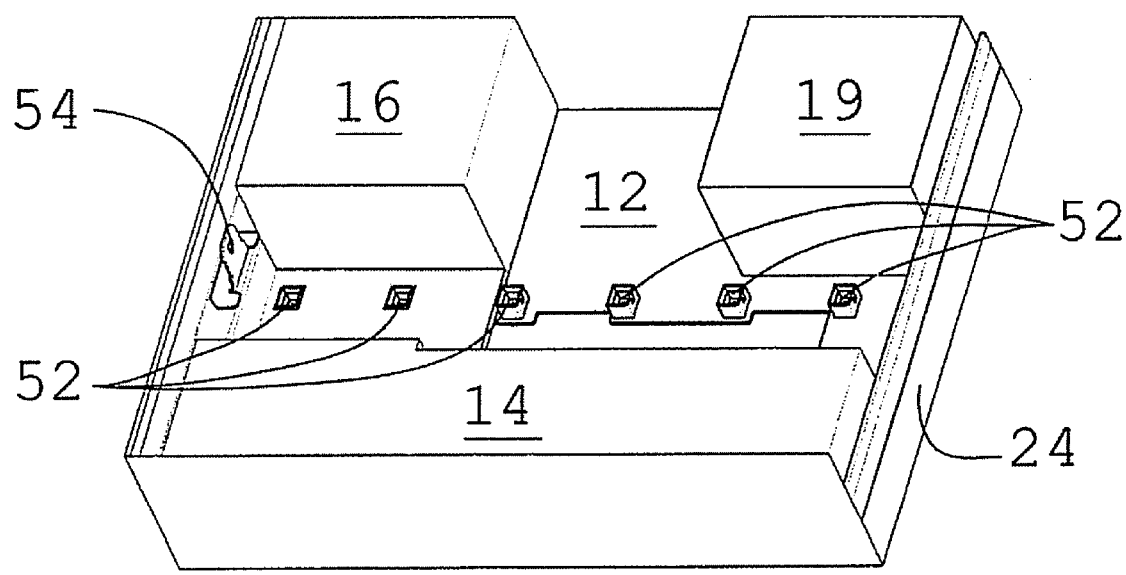
FIG. 5 is a perspective view of a portion of a dense server adapted to receive a fan cage assembly constructed in accordance with one embodiment of the present invention.

Referring now to FIG. 5, a simplified view of a portion of the server of FIG. 1 is shown with the fan cage assembly 20 removed. Visible on the system board 12 are the hot-plug sockets 52 that interface with the blind mating plugs 32 on the fan assemblies 26. Attached to the chassis 24 are brackets 54 that provide attachment points for the spring latches 40 on the fan cage 36. These brackets 54 provide a stable mounting position for the fan cage assembly 20.

Figure 6:
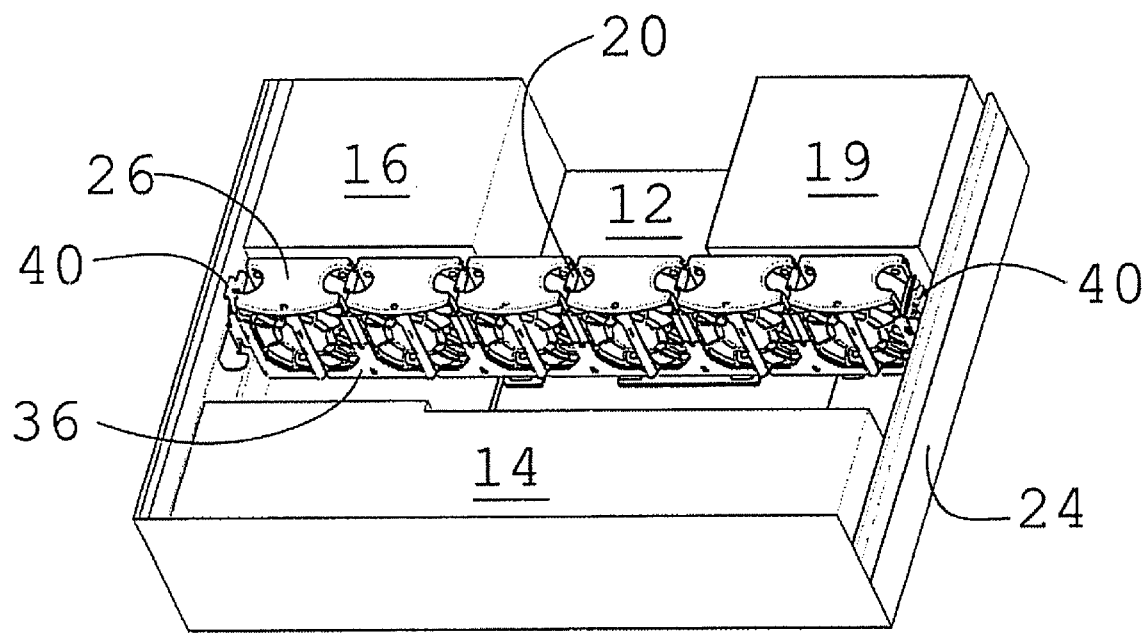
FIG. 6 is a perspective view of a portion of a dense server with a fan cage assembly with all fans installed.

As shown in FIG. 6, fan cage assembly 20 can be installed onto system board 12 by simply pressing the assembly into place. Spring latches 40 preferably engage brackets 54 as the cage 36 is moved downward. Fan cage assembly 20 can be installed with any number of individual fan assemblies 26 installed. Blind mating electrical plugs 32 engage sockets 52 as the fan cage assembly 20 is installed. FIG. 6 shows the fan cage assembly 20 installed on system board 12 with all fan assemblies 26 installed. The cage 36 can also be installed in the server 10 without any fan assemblies 26. After installation of cage 36, the individual fan assemblies 26 can subsequently be installed one at a time into cage 36.

The fan cage assembly 20 can be removed from the system board 12 by releasing the spring latches 40 and lifting out the entire assembly. This method can be used to remove the entire fan cage assembly 20, including all fan assemblies 26, at one time without the use of any tools. If the fan assemblies 26 are hot-pluggable, the removal can occur while the server is operating.

Figure 7:
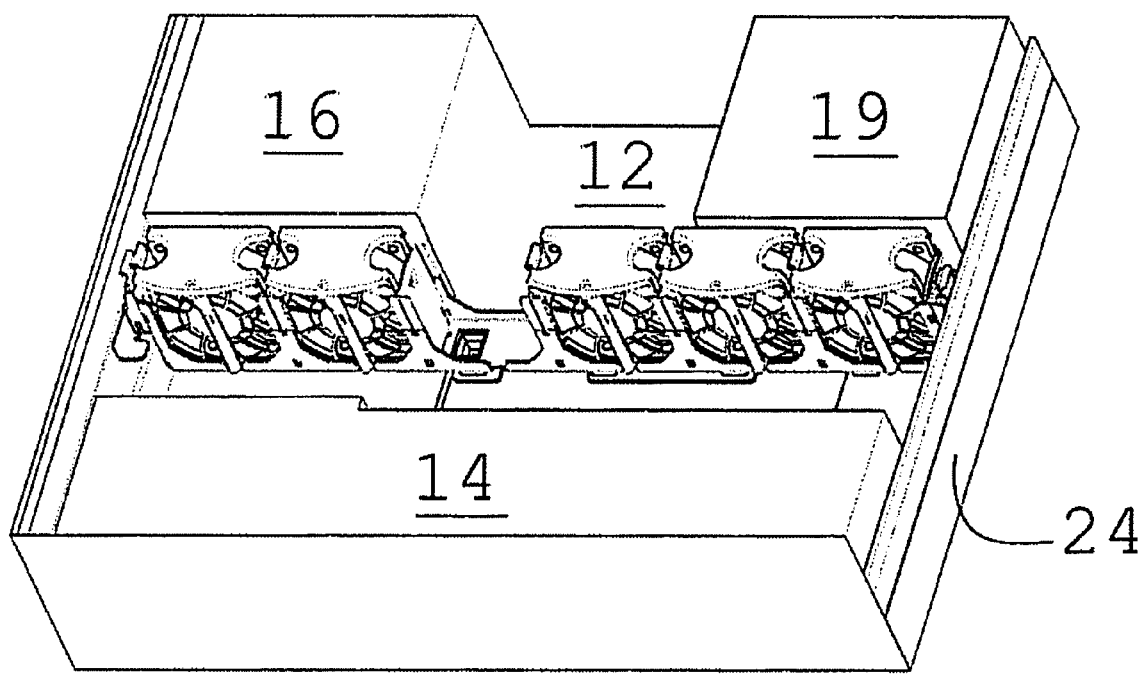
FIG. 7 is a perspective view of a portion of a dense server with a fan cage assembly with one fan removed.

Alternatively, as shown in FIG. 7, an individual fan assembly 26 can be removed from the cage 36 by releasing latch 34 and lifting that particular assembly. This removal can be accomplished without disturbing the other individual fan assemblies 26. Thus, individual fans can be removed and replaced while the server and other fans are running.

The embodiments of the present invention provide a flexible system for installing and removing cooling fans from electronic devices. Individual fans can be installed and removed as individuals or as one of many fans in a fan cage assembly. The fans and fan cage assembly can be easily removed without using tools or having to manipulate loose hardware. Thus, the embodiments of the present invention provide quick and simple alternatives for maintaining cooling fans, thereby lowering maintenance costs. These savings are particularly beneficial in large computer server applications that use hundreds or thousands of servers with each server having several cooling fans.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

What is claimed is:

1. A computer, comprising:

a chassis;

a system board attached to said chassis and having a plurality of electrical sockets;

a cage having a plurality of receptacles and a first attachment mechanism for releasably attaching said cage to said chassis, wherein said first attachment mechanism can be engaged and disengaged from said chassis without tools; and a plurality of fans adapted to fit within the receptacles and each fan having a plug to attach to one of said sockets and a second attachment mechanism to releasably attaching the fan to said cage.

2. The computer of claim 1 wherein said fans are hot-pluggable.

3. The computer of claim 1 wherein said second attachment mechanisms can be engaged and disengaged without tools.

4. The computer of claim 1 wherein said plurality of fans can be installed or removed from said system board simultaneously with said cage.

5. The computer of claim 1 wherein each individual fan of said plurality of fans can be installed or removed from said system board independently of other individual fans of said plurality of fans.

6. A fan cage holding a plurality of fans, comprising:

a first and second side panel having openings allowing the free flow of air through the plurality of fans;

a first and second end panel, each end panel having a latch mechanism attached thereto; and a base panel attached to said side and end panels forming the bottom of a rectangular, open-top enclosure, wherein said base panel has means through which there is electrical communication between a socket on a system board and a plug on one of the plurality of fans and said latch mechanisms maintain the relative position between the fan cage and the system board.

7. The fan cage of claim 6 wherein each of the fans has a releasable attachment that interfaces with said cage and that can be manipulated without tools.

8. The fan cage of claim 6 wherein the fans are hot-pluggable.

9. The fan cage of claim 6 wherein said plurality of fans can be connected or disconnected from said system board simultaneously with said cage.

10. The fan cage of claim 6 wherein each individual fan can be installed or removed from said cage independently of other individual fans.

* * * * *